US005432046A

United States Patent [19]

Wanat et al.

[11] Patent Number: 5,432,046

[45] Date of Patent: Jul. 11, 1995

[54] PROCESS FOR PREPARING IMPROVED LITHOGRAPHIC PRINTING PLATES BY BRUSHGRAINING WITH ALUMINA/QUARTZ SLURRY

[75] Inventors: Stanley F. Wanat, Scotch Plains; Major S. Dhillon, Belle Mead; Gerhard Sprintschnik, Branchburg; Allen W. Loveland, Washington; Dennis A. King, Edison, all of N.J.

[73] Assignee: Hoechst Celanese Corporation, Somerville, N.J.

[21] Appl. No.: 128,913

[22] Filed: Sep. 29, 1993

[51] Int. Cl.[6] .......... G03F 7/30; G03F 7/38

[52] U.S. Cl. .......... 430/278; 430/275; 430/302; 430/325; 430/326; 430/327; 101/454; 101/463.1

[58] Field of Search .......... 430/278, 325, 326, 327, 430/302, 275; 101/454, 463.1

[56] References Cited

U.S. PATENT DOCUMENTS

| | | | |
|---|---|---|---|
| 4,153,461 | 5/1979 | Berghauser et al. . | |
| 4,183,788 | 1/1980 | Fromson et al. | 430/278 |
| 4,452,674 | 6/1984 | Gillich et al. | 430/278 |
| 4,477,317 | 10/1984 | Chu et al. | 204/33 |
| 4,561,944 | 12/1985 | Sasaki et al. . | |
| 4,566,959 | 1/1986 | Mohr | 204/129.75 |
| 4,566,960 | 1/1986 | Mohr | 204/129.75 |
| 4,786,381 | 11/1988 | Mohr et al. | 204/129.75 |
| 4,865,951 | 9/1989 | Huddleston et al. | 430/278 |
| 4,909,894 | 3/1990 | Uesugi et al. | 156/640 |
| 5,200,291 | 4/1993 | Wanat | 430/163 |
| 5,279,927 | 1/1994 | Walls et al. | 430/331 |

FOREIGN PATENT DOCUMENTS

| | | |
|---|---|---|
| 62-027191 | 2/1987 | Japan . |
| 61-262122 | 4/1987 | Japan . |

*Primary Examiner*—Charles L. Bowers, Jr.
*Assistant Examiner*—Christopher G. Young
*Attorney, Agent, or Firm*—Palaiyur S. Kalyanaraman

[57] ABSTRACT

Provided herein is a brushgraining process to improve the quality of lithographic printing plate substrate surfaces. In the process, the surface is brushed in an aqueous slurry comprising a mixture of particulates of alumina and quartz in a weight ratio range 95:5 to 5:95, with the particulates being in the size range of 1–20 microns. Such a process surprisingly lessens the number of scratches produced on the substrate surface than when compared to using alumina alone or quartz alone or a mixture of alumina and quartz with particle sizes higher than the range disclosed.

23 Claims, No Drawings

PROCESS FOR PREPARING IMPROVED LITHOGRAPHIC PRINTING PLATES BY BRUSHGRAINING WITH ALUMINA/QUARTZ SLURRY

FIELD OF THE INVENTION

This invention discloses a process for preparing improved lithographic plates and improved lithographic plates prepared therefrom.

BACKGROUND OF THE INVENTION

The art of lithography is well known and is practiced commercially in several fields including, for example, the electronic industry, newspaper industry, magazines, and the like. The field of lithography has been extensively written and commented upon in several books and articles. See, for example, Kirk-Othmer, *Encyclopedia of Chemical Technology*, Vol. 19, p. 140, John Wiley & Sons (1982); ibid, Vol. 20, p. 161 (1982); and Encyclopedia of Polymer Science and Engineering, Vol. 13, p. 373, John Wiley & Sons (1988).

A typical lithographic printing plate comprises a substrate surface, typically made of aluminum, silicon and the like, with a photosensitive layer on top. The preparation of the lithographic printing plate generally comprises cleaning the aluminum base, roughening it to make it suitable to receive the layers that go on top, anodically oxidizing it, followed by conditioning the surface and depositing the photosensitive layer on top. If defects occur in any of these steps, the quality of the printing plate suffers. Thus, for example, when the conditioning process is not of optimum quality, it affects the sensitivity to the background in the printed images, resulting in "toning". Copending patent application, Ser. No. 08/128,911, filed of even date herewith, describes an improved process for conditioning and improving the hydrophilicity of the plate.

The roughening ("graining") step is another area of concern in the lithographic industry. Traditionally roughening of aluminum plates is performed by electrochemical or mechanical process. U.S. Pat. No. 4,786,381 discloses an electrochemical process for modifying the surface of an aluminum plate. The mechanical process includes processes such as ball graining, brush graining, and the like.

There are several problems associated with known roughening processes. Thus, for example, in the ball graining process, high skills are required for the selection of the kind or the size of balls, control of water during the abrasion and the like. The brush graining process has some drawbacks too. In brush graining, generally the plate is brushed with a brush in a slurry comprising the roughening particles. It is difficult to obtain high roughness and scattering is easily formed on the coarse face by the wear of the abrasion brush being used. Further, there are problems that the surface of the aluminum is scratched by the strong friction between the brush and larger particles of the abrasion.

U.S. Pat. No. 4,183,788 discloses a brushing process for making lithographic plates wherein the lithographic base, aluminum, is grained with an aqueous slurry comprising unfused, platy crystalline alumina using a rotary brushing motion whose force is predominantly tangential to the surface of the base plate. This process has some disadvantages too. The alumina does not stay suspended in the aqueous slurry during use. There is a tendency for the particulates to settle down during use, necessitating the continuous use of pumps to keep the particles in a state of suspension.

In an effort to avoid such problems with alumina-containing slurry, silica (quartz) has been proposed as the graining medium. However, quartz is known to cause a health hazard, silicosis, particularly when it is present as fine particles. Furthermore, quartz particulates break down easily during use, necessitating continuous replenishment.

Thus, it would be desirable to have a graining process whereby good quality lithographic plates can be produced without the above-noted problems. It would be preferable if such graining processes result in fewer number of scratches on the substrate surface. It would also be desirable if the process has minimum breakdown of the particles or increased slurry stability and thus does not need an undue amount of replenishment during a run.

SUMMARY OF THE INVENTION

Applicants have discovered that employing an aqueous slurry comprising a mixture of alumina and quartz in a brush graining process surprisingly yields a highly improved lithographic substrate surface. The inventive slurry has good use life and does not need undue replenishment during use. Furthermore, and surprisingly, the inventive slurry comprising quartz and aluminum causes far fewer number of scratches on the substrate surface than a slurry comprising alumina without quartz under comparable conditions.

The inventive slurry generally contains about 5–95 weight %, preferably about 5–50 weight % and typically about 10–20 weight % of quartz in alumina. The alumina and quartz particulates have a mean particle size of about 1–20 microns, preferably about 1–10 microns and typically about 3–6 microns. While the graining may be carried out by the conventional method of using a plurality of brushes, in most case use of a single brush is sufficient.

DESCRIPTION OF THE PREFERRED EMBODIMENTS

An embodiment of the present invention discloses a brush graining process whereby a lithographic substrate surface is roughened uniformly and efficiently with minimum number of scratches introduced during the graining process. In the inventive graining process, the substrate surface is roughened in a slurry comprising alumina and quartz particulates. Such a surface ultimately results in a superior performing lithographic plate in a cost effective manner.

The general process for the preparation of a lithographic ("printing") plate using the inventive graining method is described below. The process starts with a suitable substrate. Suitable substrates include metal, silicon, plastics such as polyester and the like materials which are well known in the art. Suitable metals for lithographic use are steel, magnesium or aluminum and its alloys. Aluminum and its alloys are preferred because of their excellent mechanical properties and relatively light weight. Of particular interest are alloys which maintain the advantages of aluminum but offer mechanical strength to prevent cracking or tearing during long runs on printing presses. The substrate may be in the form of a plate, coil, web and the like. While the inventive process may conceivably be used on a wide variety of substrate materials, the following description illustrates the use of the process with aluminum substrates.

The aluminum substrate is first cleaned to remove milling oils and surface impurities. Cleaning may be done by a variety of solvent or aqueous alkaline treatments. Typical alkaline degreasing agents include: hot aqueous solutions containing alkalis such as potassium hydroxide, sodium hydroxide, trisodium phosphate, sodium silicate, and aqueous alkalis mixed with surfactants. Solvent type degreasers such as trichloroethylene, 1,1,1 trichloroethane, perchloroethylene can be used but are less popular because of increasing environmental and health considerations. The degreasing may be done by immersion, spray or vapor washing with the listed agents.

The cleaned aluminum surface is then subjected to the inventive graining process. In the process, the graining is done using one or more brushes in an aqueous slurry comprising a mixture of fine alumina and fine quartz. The terms "fine alumina" and "fine quartz" respectively refer to alumina and quartz particulates with a mean particle size generally in the range of about 1–20 microns, preferably about 1–10 microns and typically about 3–6 microns, as measured by the Microtrac instrument (supplied by Leeds and Northrup, St. Petersburg, Fla.). The amount of quartz in the mixture of alumina and quartz generally ranges from about 5–95 weight %, preferably about 5–50 weight % and typically about 10–20 weight %.

The particulate alumina used in the invention is unfused, anhydrous, crystalline alumina having a plate-like or tablet-like particle configuration. The flat dimension is generally three to five times greater than the thickness. This form of alumina can be obtained from hydrated alumina but is generally made from $\alpha$-alumina trihydrate. Alumina useful in the practice of the invention is commercially available from suppliers such as, for example, Alcoa Surface Treatments, Bauxite, Ark.

The particulate quartz used in the present invention has a angular configuration. Useful grade quartz is commercially available from Agsco Corporation, Hasbrouk heights, N.J.

To form the graining medium, alumina and quartz are mixed in the desirable ratio described above, and made into a slurry in water. The solids concentration in the aqueous abrasive slurry is generally about 5–50 weight %, preferably about 10–40 weight % and typically in the range 15–30 weight %. The alumina and quartz may be first mixed together and then mixed with the water to prepare the slurry; alternatively, the two particulate materials may be added one after the other, in any order, to the water, to form the slurry. During the graining process, the slurry is kept in a continuously agitated condition.

Graining of the aluminum base plate is done by the brush graining technique. Conventional methods generally employ a plurality of rotating brushes. U.S. Pat. No. 4,183,788, referred to above, describes such a process whereby the graining is done while applying a rotary brushing motion whose force vector is predominantly tangential to the surface of the aluminum, using a plurality of brushes rotating in the web direction. While the instant invention may be practiced using such conventional processes, inventors have found that use of a single brush moving counter to the web is generally adequate and also results in a superior quality grained plate. Whichever brushing technique is used, generally a mean roughness of about 0.2 to about 1.0 Ra is produced in a typical graining process. Ra is a measurement of average roughness of the surface and is defined as the arithmetic average of all departures of the roughness profile from the center line within the desired evaluation length.

As the following EXAMPLES section demonstrates, the advantages of the inventive graining process are shown by the fewer number of scratches the instant process results in as compared to processes that employ alumina alone or quartz alone, or alumina and silica mixtures with particle sizes higher than the ranges described above. Generally, the scratches produced on the aluminum surface can be inspected and counted, using the naked eye or by using a magnifying instrument such as, for example, a 12X magnifying glass. By counting the number of scratches per square meter on the plates prepared by the inventive graining process, a direct measure of the number of scratches is made. This number may be compared with the number on the plates prepared in the graining processes employing alumina alone, or quartz alone, or mixtures with particle sizes higher than the ranges disclosed in this invention. The results achieved in the EXAMPLES section demonstrate the substantial improvement achievable by the instant process.

In another embodiment, the present invention discloses improved lithographic printing plates prepared using the graining process described above. In order to prepare a lithographic printing plate, after the graining step is completed according to the present invention, the substrate plate is processed through a series of steps. Some such further processing steps may include etching, rinsing, anodizing, conditioning, coating with a photosensitive layer, and the like. Copending patent application, Ser. No. 08/128,925, filed of even date herewith, describes some of these steps.

If etching of the substrate is desired, the substrate may be optionally etched in aqueous caustic or acid baths to remove surface deposits generated by graining and aerial oxide formed on the labile aluminum surface. Etching is followed by rinsing. Steps following surface roughening are preferably, though not exclusively, done with the metal kept wet.

The metal surface may then be optionally anodized ("oxidized") to improve surface hardness and wear resistance of the final product. Anodization is typically carried out in aqueous inorganic electrolyte baths where the aluminum surface acts as the anode in an electrochemical process. Preferred electrolytes are the strong acids such as sulfuric and phosphoric. Organic acids and mixtures may additionally be used to impart specific properties to the final product. Anodization is generally performed at temperatures between ambient to about 212° F., as is well known to those skilled in the art. Generally an oxide weight of about 0.25–3.5 gram/$m^2$ is built on the surface in a typical lithographic plate process.

The anodized plate is then rendered more hydrophilic by a conditioning process. U.S. Pat. No. 4,153,461 discloses the use of polyvinyl phosphonic acid ("PVPA") as a conditioning agent. Copending patent application, Ser. No. 08/128,925, referred to above, describes an improved conditioning process which comprises using a conditioning reagent comprising PVPA solution partially neutralized to, and maintained at, a pH of about 2.5 to 6.6. Such an improved conditioning process renders the surface more hydrophilic, thereby requiring fewer number of sheets to clean out when the lithographic printing plate is ultimately utilized to make prints. An important criterion for the performance of the printing plate is the number of sheets needed for cleanout during use. The fewer the number of sheets that are required to clean out the better is the performance of the printing plate.

After the conditioning step, the substrate is rinsed with water, then dried with forced hot air, and then coated with a photosensitive layer. Photosensitive layers are made from photosensitive compounds that may be optionally mixed with suitable additives such as, for example, binder resins, photoinitiators, colorants, acid stabilizers, exposure indicators, surfactants and the like, known to those skilled in the art. Photosensitive compounds ("light sensitive compounds") useful in the practice of the invention include, for example, those described, in U.S. Pat. Nos. 3,849,392; 3,867,147; 4,157,918, and 4,183,788. Additives that may be used in combination with such light sensitive compounds include those described in U.S. Pat. No. 3,679,419.

Photosensitive compounds are of two types: positive and negative working types. Positive types are those where the area of the plate exposed by light radiation through a mask are removed in the development step. In negative types, the exposed areas are hardened and remain after development.

Positive working photosensitive materials suitable in the practice of the invention are iminoquinone diazides, ortho-quinone diazides and the like, which contain sulfonic acid esters of such diazides, prepared by reacting the appropriate sulfonyl chlorides with one or more labile aromatic hydroxyl groups. Preferred are the ortho-quinone diazides containing the above-described sulfonic acid ester groups. These esters undergo a photo Wolff rearrangement whereby loss of nitrogen is followed by a ring contraction and generation of a carboxylic acid which is easily removed using alkaline developing solutions. Several such positive acting compounds are described in, for example, U.S. Pat. Nos. 3,175,906 and 4,157,918.

Negative type photosensitive materials are generally made by using the photo-labile crosslinking capabilities of oligomeric compounds such as, for example, the diazonium compounds, or the photo-polymerization of reactive monomers, or a combination of both. Several are described, for example, in U.S. Pat. Nos. 3,849,392; 3,867,147; 4,157,918; 4,183,788 and 5,200,291. These are generally free radical polymerizations which are inhibited by oxygen. Oxygen barrier coatings are generally made atop the photosensitive coating to prevent interference from aerial oxygen when using negative photopolymer products. Generally, the photosensitive layer is selected based on the actinic radiation that is going to be used for exposure, as is known to those skilled in the art. The present invention may be practiced with both positive and negative type photosensitive materials.

The light sensitive compound may optionally be mixed with additives as described above to form a photosensitive coating material, if so desired. For example, acid stabilizers may be used with diazonium compounds; suitable acid stabilizers are generally organic or inorganic acids. Examples include phosphoric, citric, benzoic, m-nitrobenzoic, p-toluenesulfonic, and the like as well as mixtures thereof. Preferably, the acid stabilizer is phosphoric acid. When used, the acid stabilizer is present generally in the amount of from about 0.02% to about 2%, and preferably from about 0.05% to about 1.0% based on the weight of the composition.

Exposure indicators (or photoimagers) which may be useful in conjunction with the present invention include 4-phenylazodiphenylamine, eosin, azobenzene, Calcozine Fuchsine dyes and Crystal Violet and Methylene Blue dyes. Preferably, the exposure indicator is 4-phenylazodiphenylamine. The exposure indicator, when one is used, is preferably present in the composition in an amount of from about 0.01% to about 0.35% by weight. A more preferred range is from about 0.02% to about 0.30% and, most preferably, the exposure indicator is present in an amount of from about 0.02% to about 0.20%, although the skilled artisan may use more or less as desired.

Colorants useful herein include dyes such as Rhodamine, Calcozine, Victoria Blue and methyl violet, and such pigments as the anthraquinone and phthalocyanine types. Generally, the colorant is present in the form of a pigment dispersion which may comprise a mixture of one or more pigments and/or one or more dyes dispersed in a suitable solvent or mixture of solvents. When a colorant is used, it is preferably present in the composition of this invention in an amount of from about 2.0% to about 35.0% by weight, more preferably from about 5.0% to about 30.0% and most preferably from about 5.0% to about 20% although the skilled artisan may use more or less as desired.

Resin binders may be used in the coating to increase the functional lifetime of the printing plates. If resin binders are desired, suitable binder resins are chosen based upon their compatibility with other coating components, the ability to be cleaned away during the development step in non-image areas of the plate and their resistance to wear on press. Resins with acid end groups are especially desirable since the acid helps stabilize the coatings based upon diazonium compounds and provides alkaline solubility for development.

In order to form a coating composition for the production of the photosensitive layer, the light sensitive compound is coated from a solution in a suitable solvent, wherein the light sensitive compound is present in amounts such that the concentration of the light sensitive compound is generally in the range 10–100% of the total solids in the dried coating upon drying (see below), preferably in the range 30–75%, and typically in the range 40–60%. Suitable solvents for this purpose include water, tetrahydrofuran, butyrolactone, glycol ethers such as propylene glycol monomethyl ether and methyl glycol methyl ether, alcohols such as ethanol and n-propanol, and ketones such as methyl ethyl ketone, or mixtures thereof. Preferably, the solvent comprises a mixture of propylene glycol monomethyl ether and butyrolactone. In general, after the solution is applied to an appropriate substrate by a suitable coating process, the solvent system is evaporated from the coating by a suitable drying process; some insignificant amount of solvent may, however, remain as residue.

The process to coat the light sensitive layer may be a batch or continuous process as is known to those skilled in the art. Some useful coating processes include dip coating, roller coating, slot type coating, spin coating, and the like, which deposit a thin uniform dry photosensitive coating on the surface once the solvents have been driven off. At the end of the coating operation and drying, generally a coating weight of from about 0.5g/m$^2$ to about 2.5g/m$^2$, preferably from about 0.8 g/m$^2$ to about 2.0 g/m$^2$ and typically about 1.0 g/m$^2$ is obtained.

The thus prepared photographic element is then exposed to suitable actinic radiation through a negative mask so as to yield a solid 5 on a 21 step Stouffer exposure wedge (supplied by Stouffer Graphic Arts Equipment Company, South Bend, Indiana) after development. Generally a radiation in the range of 300–400 nm is employed. The exposed plate is then developed with a suitable developer. Suitable developer may be aqueous developer, or aqueous developer mixed with a suitable organic solvent. An aqueous developer useful in the present invention comprises an aqueous solution containing one or more of the following groups:

(a) a sodium, potassium Or lithium salt of octyl, decyl or dodecyl monosulfate;

(b) a sodium, lithium, potassium or ammonium metasilicate salt;

(c) a lithium, potassium, sodium, or ammonium borate salt;

(d) an aliphatic dicarboxylic acid, or sodium, potassium or ammonium salt thereof having from 2 to 6 carbon atoms; and (e) mono-, di-, or tri-sodium, or -potassium phosphate.

Other suitable developers include water, benzoic acid or sodium, lithium and potassium benzoates and the hydroxy substituted analogs thereof as well as those developers described in U.S. Pat. No. 4,436,807.

In conventional use, the developed plate is finished with a subtractive finisher such as a hydrophilic polymer. Examples include cold water soluble dextrin and/or polyvinyl pyrrolidone, a nonionic surfactant, a humectant, an inorganic salt and water, as taught by U.S. Pat. No. 4,213,887.

For the purpose of improving the press performance of a plate prepared as described above, it is known that baking of the exposed and developed plate can result in an increase in the number of quality impressions over that otherwise obtainable. To properly bake the plate, it may be first treated with a suitable solution designed to prevent loss of hydrophilicity of the background during baking. An example of a suitable solution is disclosed in U.S. Pat. No. 4,355,096. The plate prepared as above may then be heat treated by baking at temperature of from about 180° C. up to the annealing temperature of the substrate, preferably about 240° C. The effective baking time is inversely proportional to the temperature and averages in the range of from about 2 to about 15 minutes.

The following Examples are illustrative of the invention but it is understood that the invention is not limited thereto.

EXAMPLES

Example 1, Comparative Example using quartz alone as the graining agent

An aluminum web was roughened by brushing it with a single 24 inch diameter brush rotating at 250 rpm counter to the web direction while using a quartz (silica) slurry with a mean particle size of −25 microns (available from Agsco, Hasbrouk heights, New Jersey) at 15% solids concentration as the abrasive medium. This substrate had a uniform matte appearance with <1–2 scratches (⅛-2" long) per square meter of surface. When this quartz slurry was used over a long brushing campaign, the mean particle size deteriorated rapidly and constant replenishment of the system (every 3,000 yds.) was needed to maintain a uniform surface. The web was coated with a photosensitive coating (a diazo resin which was the polycondensation product of 3-methoxy-4-diazo diphenyl amine sulfate and 4,4'-bismethoxy methyl-diphenyl ether, precipitated as mesitylene sulfonate, described in U.S. Pat. No. 4,157,918, and a modified polyvinylacetal resin described in U.S. Pat. No. 4,940,646) and exposed to U.V. light (365 nm) through a negative mask for 30 seconds using a Teaneck exposure unit (sold by teaneck Graphics Systems, Teaneck, New Jersey, using a L1250 UV light source from Olec Corporation, Irvine, Cal.). The plates were developed in an aqueous developer (sold under the trade name ND-143 by Hoechst Celanese Corporation, Printing products Division, Branchburg, N.J.). The sensitivity to background toning was measured by running imaged plates on press in a dry scum cycle test using Kohl-Madden red ink on a Heidelberg printing press. The number of sheets needed to print cleanly was determined after application of the dampening rollers. Over 100 copies were run without successfully cleaning out the scummed area.

Example 2, A Second Comparative Example with quartz as the graining medium

A web processed as described in Example 1 was roughened using a fine grade of quartz having a mean particle size of 4.8 microns. A light matte surface was obtained with 1–2 scratches (⅛-2") per square meter of substrate. Particle size broke down rapidly and requires periodic replenishment. Coated plates, in contrast to those made in Example 1, cleaned up in 40 sheets when printed by the procedure listed in Example 1.

Example 3, Comparative Example using alumina alone as the graining agent

A web was processed the same as in Example 1 except the slurry was composed of alumina (Grade A12-325 from Alcoa Surface Treatments) with a median particle size of 5 microns. The substrate was a lighter matte finish than the material made from Example 1, however, 12 scratches (⅛-2" long) were found/square meter of surface. A measure of the mean particle size showed almost no change over the course of a brushing cycle of about 25,000 yards in contrast to the constant replenishment seen with the quartz in Example 1. Coated plates were imaged and run on press as described in Example 1. These plates cleaned up in 30–40 copies by comparison to the plates of Example 1. Although the print quality was improved, cosmetically unappealing scratches were numerous (12/square meter).

Concentrations of 1014 40% of slurry were used in this Example.

Example 4. Comparative Example using alumina with higher particle size as the graining medium:

A web was processed by the same process described in Example 1 except that the slurry was made up with a coarser grade of pure alumina (mean particle size >20 microns). These plates had >10 scratches (⅛-2" long) per square meter. In addition, when coated, imaged and run on press they took >80 sheets to print cleanly.

Examples 5–9, Examples using inventive slurries of alumina and quartz mixtures Examples 5–9 show processing of aluminum webs under conditions as in Examples 1–4 above but using slurties made of various combinations of fine grade alumina (~5 micron mean article size) and fine grade quartz (~5 micron) as the graining media. (See Table 1). Solids concentrations in these slurties were ~30%. As Table I shows, the grained substrates averaged just 1-2 scratches/square meter comparable to the quality found with 100% quartz alone of Examples 1-2, but substantially superior to alumina of Examples 3-4. However, unlike the quartz slurties of Examples 1-2, the mean particle size in Examples 5-9 remained constant with little or no breakdown of the slurry during graining. The improved tepography of the substrates in Examples 5-9 are compared to that of Examples 1-4 was also shown byGray Scale Contrast Scanning Electron Microscopy.

TABLE 1

| Example | % Alumina | % Quartz | Print Cleanout | Scratches | Breakdown |
|---|---|---|---|---|---|
| 5 | 90 | 10 | 30 | 1-2 | little |
| 6 | 80 | 20 | 40 | 1-2 | little |
| 7 | 70 | 30 | 30 | 1 | little |
| 8 | 60 | 40 | 30 | 1 | moderate |
| 9 | 50 | 50 | 40 | 1 | moderate |

Example 10. Example using more than one brush for graining

A web was processed using 6 rotating brushes which rotate in the same direction of web travel and uses 90% of the fine alumina (grade A12-325 from Alcoa Surface Treatments, Bauxite, Arkansas) and 10% of 5the fine grade quartz (10/0 grade from Agsco Corp. Hasbrouck Heights, N.J.). The substrate had a uniform appearance with a minimum of scratches. The coated plate cleaned up in 30–40 sheets when printed per the description in Example 1. The slurry mean particle size remained intact for a long period in contrast to the rapid breakdown when using quartz alone.

What is claimed is:

1. A process to prepare a lithographic printing plate, sequentially comprising:
 (a) providing a substrate made of a suitable metal;
 (b) brushgraining said substrate in an aqueous slurry comprising a mixture of particulates, wherein said mixture comprises alumina and quartz in a weight ratio in the range of 95:5 to 5:95, and wherein said particulates have particle size in the range 1-20 microns;
 (c) conditioning said surface polyvinylphosphonic acid maintained at a pH range of about 2.5 to 6;
 (d) applying a photosensitive layer;
 (e) imagewise exposing said photosensitive layer to suitable actinic radiation; and
 (f) developing said exposed layer in a suitable developer thereby resulting in an image commensurate with the type of said photosensitive layer in step (d) above.

2. The process as described in claim 1, wherein said substrate is made of aluminum or steel.

3. The process as described in claim 1, wherein said mixture comprises alumina and quartz in a weight ratio in the range of 90:10 to 80:20.

4. The process as described in claim 1, wherein said particle size is in the range 1-10 microns.

5. The process as described in claim 1, wherein said particle size is in the range 3-6 microns.

6. The process as described in claim 1, wherein said graining is done using a single brush.

7. The process as described in claim 1, wherein said graining is done using a plurality of brushes.

8. The process as described in claim 1, wherein said aqueous slurry has a solids concentration of about 5-50 weight percent.

9. The process as described in claim 1, wherein said aqueous slurry has a solids concentration of about 15-30 weight percent.

10. The process as described in claim 1, wherein said photosensitive layer comprises a photosensitive compound of positive type.

11. The process as described in claim 10, wherein said positive photosensitive compound is a sulfonic acid ester of an orthoquinone diazide.

12. The process as described in claim 1 wherein said photosensitive layer comprises a photosensitive compound of negative type.

13. The process as described in claim 12, wherein said negative photosensitive compound is a diazonium compound.

14. The process as described in claim 13, wherein said diazonium compound is a polycondensation product of 3-methoxy-4-diazo diphenyl amine sulfate and 4,4'-bis-methoxy methyl-diphenyl ether, precipitated as mesitylene sulfonate.

15. The process as described in claim 1, wherein said actinic radiation has a wavelength range 300–400 nm.

16. The process as described in claim 1, wherein said developer is an aqueous developer selected from the group consisting of sodium octyl monosulfate, potassium decyl monosulfate, lithium dodecyl monosulfate and combinations thereof.

17. The process as described in claim 1, wherein said brushgrained substrate is further oxidized.

18. A lithographic printing plate prepared by the process described in claim 1.

19. A process to prepare a lithographic printing plate, sequentially comprising:
 (a) providing an aluminum substrate;
 (b) brushgraining said aluminum substrate in an aqueous slurry comprising a mixture of particulates, wherein said mixture comprises alumina and quartz in a weight ratio in the range of 95:5 to 5:95, and wherein said particulates have particle size in the range 1-20 microns;
 (c) conditioning said surface with polyvinylphosphonic acid maintained at a pH range of about 2.5 to 6.
 (d) applying a photosensitive layer;
 (e) imagewise exposing said photosensitive layer to suitable actinic radiation; and
 (f) developing said exposed layer in a suitable developer thereby resulting in an image commensurate with the type of said photosensitive layer in step (d) above.

20. The process as described in claim 19, wherein said mixture comprises alumina and quartz in a weight ratio in the range of 90:10 to 80:20, and wherein said particle size is in the range 1-10 microns.

21. The process as described in claim 19, wherein said brushgrained aluminum substrate is further oxidized.

22. A process for graining lithographic substrate surfaces, wherein said graining is done in an aqueous slurry comprising a mixture of particulates, wherein said mixture comprises alumina and quartz in a weight ratio in the range of 95:5 to 5:95, and wherein said particulates have particle size in the range 1-20 microns.

23. The process as described in claim 22, wherein said substrate is made of aluminum.

* * * * *